(12) United States Patent
Landolt

(10) Patent No.: US 7,394,420 B2
(45) Date of Patent: Jul. 1, 2008

(54) HIGH-SPEED ANALOG/DIGITAL CONVERTER

(75) Inventor: Oliver Landolt, Taufkirchen (DE)

(73) Assignee: Rohde & Schwarz GmbH & Co., KG, Munich (DE)

( * ) Notice: Subject to any disclaimer, the term of this patent is extended or adjusted under 35 U.S.C. 154(b) by 0 days.

(21) Appl. No.: 11/470,789

(22) Filed: Sep. 7, 2006

(65) Prior Publication Data

US 2007/0057832 A1    Mar. 15, 2007

(30) Foreign Application Priority Data

Sep. 12, 2005    (EP)    ................................. 05019801

(51) Int. Cl.
    *H03M 1/36*    (2006.01)
(52) U.S. Cl. ...................... 341/158; 341/159
(58) Field of Classification Search ................ 341/156, 341/158, 159
    See application file for complete search history.

(56) References Cited

U.S. PATENT DOCUMENTS

| 3,984,832 | A |   | 10/1976 | Henry |         |
|-----------|---|---|---------|-------|---------|
| 4,057,795 | A | * | 11/1977 | Timsit | 341/159 |
| 4,275,386 | A | * | 6/1981 | Michel et al. | 341/159 |
| 5,157,397 | A | * | 10/1992 | Vernon | 341/159 |
| 5,175,550 | A | * | 12/1992 | Kattmann et al. | 341/159 |
| 5,204,679 | A | * | 4/1993 | Jessner et al. | 341/159 |
| 5,231,399 | A | * | 7/1993 | Gorman et al. | 341/159 |
| 5,376,937 | A | * | 12/1994 | Colleran et al. | 341/159 |
| 5,396,131 | A |   | 3/1995 | Miki et al. | |
| 5,589,831 | A | * | 12/1996 | Knee | 341/159 |
| 5,598,161 | A |   | 1/1997 | Yamada | |
| 5,600,275 | A |   | 2/1997 | Garavan | |
| 5,736,952 | A |   | 4/1998 | Kertis et al. | |
| 6,437,724 | B1 |  | 8/2002 | Nagaraj | |
| 6,445,221 | B1 |  | 9/2002 | Poss | |
| 6,847,320 | B1 | * | 1/2005 | Taft et al. | 341/155 |
| 6,882,294 | B2 | * | 4/2005 | Linder et al. | 341/156 |
| 2005/0030216 | A1 | | 2/2005 | Linder et al. | |

FOREIGN PATENT DOCUMENTS

WO    02078191    10/2002
WO    03088498    10/2003

OTHER PUBLICATIONS

IBM Technical Disclosure Bulletin, "Differential High-Speed Analog to Digital Converter," vol. 38, No. 1, Jan. 1995.
Scholtens, P., et al., "A 6-b 1.6-Gsample/s Flash ADC in 0.18-um CMOS Using Averaging Termination," IEEE Journal of Solid State Circuits, vol. 17, No. 12, Dec. 2002.
Lee, J., et al., "A 5-b 10-GSample/s A/D Converter for 10-GB/s Optical Receivers," IEEE Journal of Solid State Circuits, vol. 39, No. 10, Oct. 2004.

* cited by examiner

*Primary Examiner*—Howard Williams
(74) *Attorney, Agent, or Firm*—Lewis, Rice & Fingersh, L.C.

(57) ABSTRACT

An analog-to-digital converter comprising a positive input terminal, a negative input terminal, several difference detection means detecting a voltage difference between a positive input port and a negative input port, first resistors connecting each positive input port of each difference detection means with the positive input terminal and second resistors connecting each negative input port of each difference detection means with the negative input terminal. First current sources are connected to the positive input port of at least some of the difference detection means. Second current sources are connected to the negative input port of at least some of the difference detection means also generating different currents.

18 Claims, 5 Drawing Sheets

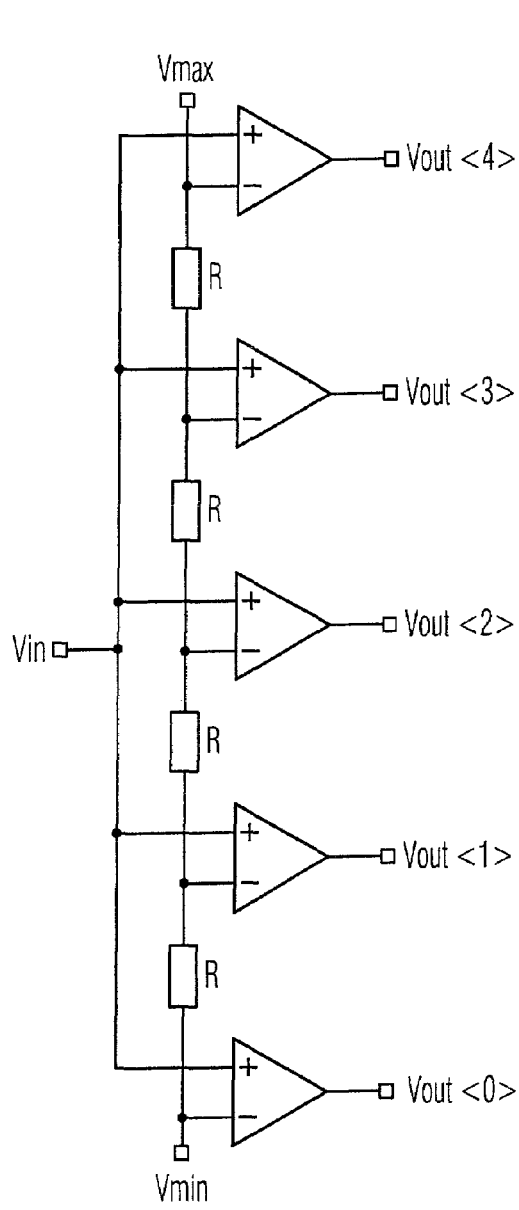
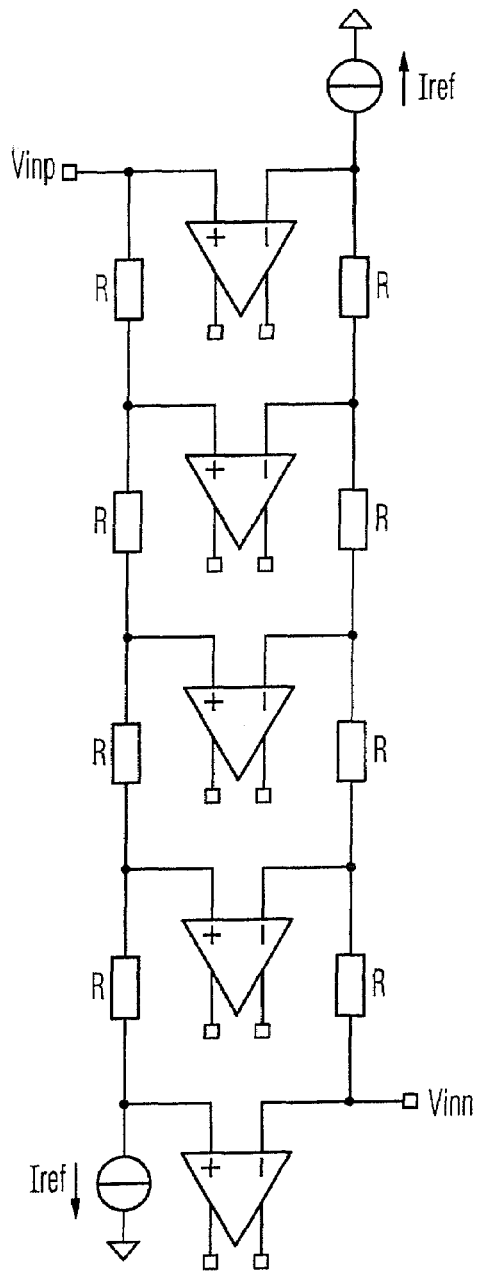
Fig. 1
PRIOR ART
Fig. 2
PRIOR ART

HIGH-SPEED ANALOG/DIGITAL CONVERTER

CROSS REFERENCE TO RELATED APPLICATION(S)

This application claims foreign priority to European Patent Application 05 019 801.9 filed Sep. 12, 2005 the entire disclosure of which is herein incorporated by reference.

BACKGROUND

1. Field of the Invention

The invention relates to a reference ladder circuit, particularly to a reference ladder circuit for use with an analog/digital converter (ADC).

2. Description of the Related Art

Many common analog/digital converter (ADC) architectures, notably Flash converters and Folding & Interpolating converters include a circuit stage—called reference ladder in the present document—comparing an analog input voltage to a set of constant reference voltages. The constant reference voltages are typically linearly spaced across the input voltage range supported by the ADC. The reference ladder typically includes a circuit generating the reference voltages and a set of differential amplifiers computing the differences between an input voltage and each reference voltage.

None of the reference ladder implementations published so far possesses all the properties of: (a) The input signal propagates to the outputs of all differential amplifiers with essentially the same delay, (b) The implementation is fully differential and (c) The reference voltages are not perturbed by the input bias current of the differential amplifiers.

Indeed, at the sampling rates and resolutions where existing ADC chips operate, satisfactory ADC performance can be achieved even if the reference ladder lacks some of these features. However, as sampling rates increase well above 1 GS/s, the above features become increasingly necessary for the following reasons: (a) Delay mismatch (a.k.a. skew) between differential amplifier outputs must remain a small fraction of the sampling period. (b) As sampling rates increase, delay matching specifications become increasingly stringent. As transistors become faster, their breakdown voltage tends to decrease. Therefore, ADC implementations pushing the speed limit must operate with ever smaller signal swings. A fully differential architecture reduces the voltage swing seen by a differential amplifier input by half compared to a single-ended or pseudo-differential architecture.

The reference ladder implementation most commonly described is depicted in FIG. 1. The input voltage Vin is applied to one input of each differential amplifier. The other amplifier input is connected to the reference voltage produced by a chain of equal resistors R. Two reference voltages vmin and vmax are applied to the endpoints of the chain. They define the boundaries of the reference voltage range. Intermediate nodes of the chain will settle to linearly spaced intermediate voltages, to the extent that the differential amplifier inputs draw only negligible current.

In practice, if the differential amplifiers are implemented using bipolar transistors in the input stage, they draw a substantial signal-dependent DC input current, which tends to distort the distribution of reference voltages. In order to minimize this effect, the value of resistors R must be chosen small enough that the DC current through the chain is much larger than the input currents of the differential amplifiers. This sensitivity to amplifier input currents is a drawback of this circuit.

The other drawback is that the circuit is single-ended. It is possible to obtain a pseudo-differential version of this circuit by combining two of them, but this solution does not lead to a reduction in input signal swing because one input of each differential amplifier remains a DC voltage.

A truly differential reference ladder implementation has been described in J. Lee, P. Roux, U. V. Koc, T. Link, Y. Baeyens, Y. K. Chen, "A 5-b 10-GSample/s A/D Converter for 10-Gb/s Optical Receivers", IEEE Journal of Solid-State Circuits, Vol. 39, No. 10, October 2004, pp. 1671-1679. This circuit is shown in FIG. 2. Input vinp is the positive side and vinn the negative side of a differential input voltage. By means of two chains of resistors R across which flows a reference current iref, a number of intermediate signals are obtained. The intermediate signals are identical to vinp and vinn except for a DC offset determined by R and iref. In this circuit, the two inputs of each differential amplifier vary in a complementary fashion. Thereby, for a same differential input voltage range seen at the amplifier inputs, the voltage swing at inputs vinp and vinn is a factor of two smaller than in the previous circuit. This feature enables significant reduction of nonlinear distortion if the input signal amplitude would otherwise cause the active devices to operate near the limit of their breakdown voltage.

A substantial drawback of the differential reference ladder circuit shown in FIG. 2 is that the input signal must propagate down a chain of resistors. Because of the input capacitance of the differential amplifiers, the signal gets delayed and low-pass filtered as it travels down the chain. The delay from the input to each differential amplifier output depends on the number of resistors on the signal path to this particular amplifier. Thereby, the delay between the positive and the negative side of a same differential amplifier cannot be well matched. Also, skew between the outputs of different amplifiers is unavoidable. For these reasons, the above circuit cannot be used in practice for very high-speed ADC.

It can be shown that input bias currents of the differential amplifier will affect the accuracy and linearity of the above reference ladder circuit to a similar extent as the circuit in FIG. 1.

SUMMARY

The following is a summary of the invention in order to provide a basic understanding of some aspects of the invention. This summary is not intended to identify key or critical elements of the invention or to delineate the scope of the invention. The sole purpose of this section is to present some concepts of the invention in a simplified form as a prelude to the more detailed description that is presented later.

The present document describes a novel reference ladder circuit presenting the following advantages: (a) the input signal propagates to the outputs of all differential amplifiers with essentially the same delay, (b) the implementation is fully differential, and (c) the reference voltages are not perturbed by the input bias current of the differential amplifiers.

It is the object of the present invention to provide a high speed analog/digital converter being suitable for differential signals and working with a very high accuracy.

The object is solved by the features of claim 1. The dependent claims comprise further developments of the invention.

According to the invention the analog-to-digital converter comprises a positive input terminal, a negative input terminal, several difference detection means detecting a voltage difference between a positive input port and a negative input port, first resistors connecting each positive input port of each difference detection means with the positive input terminal and second resistors connecting each negative input port of each difference detection means with the negative input terminal. First current sources are connected to the positive input port of at least some of the difference detection means generating different currents. Second current sources are connected to the negative input port of at least some of the difference detection means also generating different currents.

Preferably the difference of the currents of the first current sources, and the second current sources increases or decreases linearly from difference detection means to difference detection means.

Alternatively the difference of the currents of the first current sources and the second current sources increases or decreases nonlinearly from difference detection means to difference detection means.

Preferably the first resistors and the second resistors have equal resistances.

Preferably the sums of currents of the first and second current sources that are connected to the same difference detection means are equal for each difference detection means.

Preferably the currents generated by the first and second current sources are integer multiples of a reference current.

Preferably the reference currents of the first current sources and the reference currents of the second current sources are identical.

Preferably first current sources generating a current differing form zero are only connected to the positive input ports of a first set of difference detection means and second current sources generating a current differing from zero are only connected to the negative input ports of a second set of difference detection means, whereby the first set and the second set do not comprise any identical difference detection means.

Alternatively current sources generating a current differing from zero are connected to positive input ports only or to negative input ports of the difference detection means only.

Alternatively a first difference detection means has a current source only at its negative input port and a last difference detection means has a current source only at its positive input port. Preferably the remaining difference detection means have current sources at its positive input ports and its negative input ports.

The advantage of this circuit over the prior art is that it combines all the following desirable features:

It is fully differential, whereby signal swing at the amplifier inputs can be reduced by a factor of two. Further advantages of a differential topology is suppression of even-order nonlinear distortion terms and good rejection of common-mode noise sources.

The delays between the inputs and all differential amplifier outputs are essentially identical because the same series resistance and parasitic load capacitance is seen by the signal on all paths.

The reference voltages are not sensitive to the input bias currents of the differential amplifiers. Indeed, around a zero-crossing, the input bias current will be essentially identical at both inputs of the differential amplifier, therefore the voltage drop across the resistances will be identical on both sides. This effect has impact only on the common-mode input voltage, not the differential voltage.

BRIEF DESCRIPTION OF THE FIGURES

An embodiment of the invention will now be described in more detail with reference to the drawings. In the drawings:

FIG. 1 shows a prior art single-ended reference ladder;

FIG. 2 shows a prior art differential reference ladder;

DESCRIPTION OF PREFERRED EMBODIMENT(S)

Figure 3:
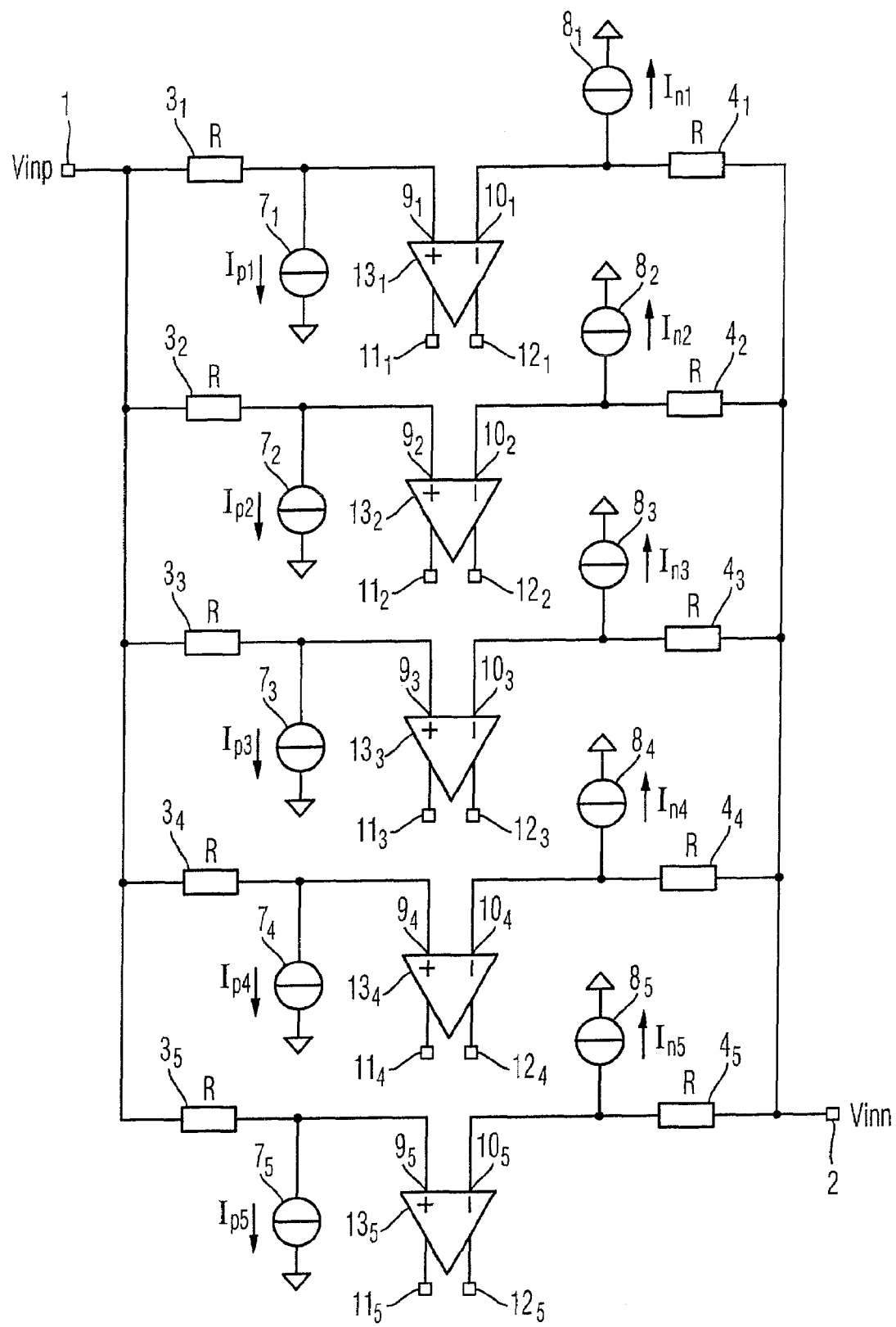
FIG. 3 shows a first embodiment of an analog/digital converter with a differential reference ladder according to the present invention.

A first embodiment of a reference ladder circuit is shown in FIG. 3. In this embodiment five difference detection means are used in the reference ladder implementation, however, in principle any number can be used. In this circuit, a resistor is inserted in the signal path between the input voltages—vinp and vinn—and each differential amplifier input. It is best if all resistors have the same value R, so that the delays across all signal paths will be essentially the same. A DC reference current is drawn at each differential amplifier input, thereby causing a DC voltage drop across the related resistor. The zero-crossing of each differential amplifier will be shifted by an offset voltage proportional to R and to the difference between the reference currents drawn at the positive and the negative inputs of the differential amplifier. In order to obtain linearly spaced offset voltages, the most straightforward choice is to use linearly spaced reference currents.

In the general case there are the currents $I_{p1}$ to $I_{p5}$ and $I_{n1}$ to $I_{n5}$ generated by the current sources connected to the positive and negative input ports of the difference detection means, respectively. In subsequent FIG. 4 the particular case is shown that $I_{pk}=(k-1)\cdot\text{Iref}$ and $I_{nk}=(5-k)\cdot\text{Iref}$, wherein k is an integer from 1 to 5. However, the current distribution over the current sources is not limited to that examples as further examples will show. For the example in FIG. 5 differential offset voltages $L\cdot R\cdot\text{Iref}$, with $L\in\{-4, -2, 0, 2, 4\}$ are obtained. Other differential offset voltages and, hence, voltage level distributions are possible. Examples as in FIGS. 5 and 6, may be suitably represented in matrix representation:

$$\begin{pmatrix} 4 & 0 \\ 2 & 0 \\ 0 & 0 \\ 0 & 2 \\ 0 & 4 \end{pmatrix} \text{ or } \begin{pmatrix} -2 & 2 \\ -1 & 1 \\ 0 & 0 \\ 1 & -1 \\ 2 & -2 \end{pmatrix} \text{ or } \begin{pmatrix} 0 & -4 \\ 0 & -2 \\ 0 & 0 \\ 0 & 2 \\ 0 & 4 \end{pmatrix}$$

where the left hand side of each matrix represents the left hand side current sources in FIG. 3 and the right hand side of the matrix represents the right hand side of the current sources in FIG. 3. In particular non-linear or non-integer distributions may be thought of. In general, the threshold of a differential amplifier is shifted by $R\cdot(I_{pk}-I_{nk})$.

In the following an embodiment will be described in detail with respect to FIG. 3. The circuit has two input terminals referenced with 1 and 2. These input terminals can be connected to the positive and negative voltage Vinp and Vinn of an input line carrying a differential signal.

The input terminal 1 of the analog-to-digital-converter circuit is connected to resistors $3_1, 3_2, 3_3, 3_4, 3_5$. Resistors $3_1, 3_2, 3_3, 3_4, 3_5$ as well as current sources $7_1, 7_2, 7_3, 7_4, 7_5$ are connected to first input ports $9_1$, $9_2$, $9_3$, $9_4$, $9_5$ of difference detection means $13_1$, $13_2$, $13_3$, $13_4$, $13_5$, respectively. A detected difference can be tapped at output ports $11_1$, $11_2$, $11_3$, $11_4$, $11_5$ of difference detection means $13_1$, $13_2$, $13_3$, $13_4$, $13_5$, respectively.

The difference detection means $13_1$-$13_5$ detect a voltage difference between its input ports $9_1$, $10_1$; $9_2$, $10_2$; $9_3$, $10_3$; $9_4$, $10_4$ and $9_5$, $10_5$, respectively. The detection means can be a comparator or a differential amplifier.

Figure 4:
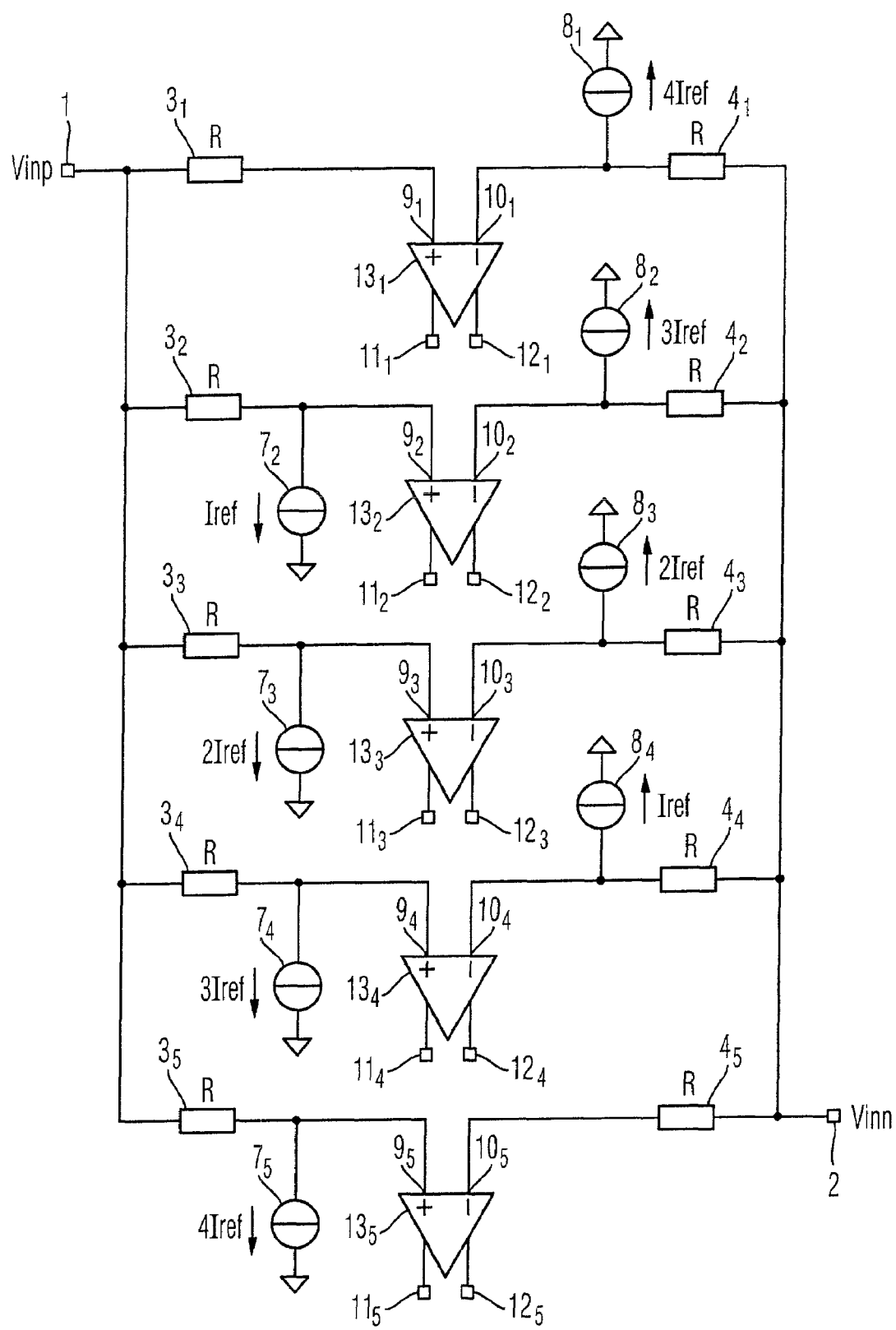
FIG. 4 shows a second embodiment of an analog/digital converter with a differential reference ladder according to the present invention.

The currents of first current sources $7_1$, $7_2$, $7_3$, $7_4$, $7_5$ as shown in subsequently explained embodiment of FIG. 4 are integer multiples of Iref. The currents are 0, Iref, 2Iref, 3Iref, and 4Iref generated by the current sources $7_1$, $7_2$, $7_3$, $7_4$, $7_5$, respectively. Hence, the voltage drops across resistors $3_1$, $3_2$, $3_3$, $3_4$, and $3_5$ are 0, R·Iref, R·2·Iref, R·3·Iref, and R·4·Iref. As a consequence at the first (positive) input ports $9_1$, $9_2$, $9_3$, $9_4$, $9_5$, the difference detection means obtain a voltage: 0, Vinp, Vinp–R·Iref, Vinp–R·2·Iref, Vinp–R·3·Iref, Vinp–R·4·Iref.

Resistors $4_1$, $4_2$, $4_3$, $4_4$, $4_5$ of the analog-to-digital-converter are connected to input terminal 2 on one side. Second resistors $4_1$, $4_2$, $4_3$, $4_4$, $4_5$ as well as second current sources $8_1$, $8_2$, $8_3$, $8_4$, $8_5$ are connected to the second (negative) input ports $10_1$, $10_2$, $10_3$, $10_4$, $10_5$ of difference detection means $13_1$, $13_2$, $13_3$, $13_4$, $13_5$, respectively.

The currents of second current sources $8_1$, $8_2$, $8_3$, $8_4$, and $8_5$ are also integer multiples of Iref. The currents of second current sources $8_1$, $8_2$, $8_3$, $8_4$, $8_5$ are 4Iref, 3Iref, 2Iref, Iref, and 0, respectively, and increase in reverse order as their counterparts connected to the first input ports $9_1$, $9_2$, $9_3$, $9_4$, and $9_5$. The voltage drops across resistors $4_1$, $4_2$, $4_3$, $4_4$, and $4_5$ are consequently R·4Iref, R·3Iref, R·2Iref, R·Iref, and 0. Thus, at the second input ports $10_1$, $10_2$, $10_3$, $10_4$, $10_5$, the difference detection means $13_1$, $13_2$, $13_3$, $13_4$, and $13_5$ obtain a voltage: Vinn–R·4Iref, Vinn–R·3Iref, Vinn–R·2Iref, Vinn–R·3Iref, Vinn.

With the above matrix representation the voltages $V_P$ and $V_n$ of the left hand side and the right hand side can be obtained from:

$$(V_p, V_n) = (V_{inp}, V_{inn}) - R \cdot \begin{pmatrix} 0 & 4 \\ 1 & 3 \\ 2 & 2 \\ 3 & 1 \\ 4 & 0 \end{pmatrix} \cdot I_{ref}$$

The general case as shown in FIG. 3 also represents the practical approach in that at each input port of a difference detection device a current source is located in order to provide the same capacitive input characteristic for all combinations of resistances ($3_1$-$3_5$; $4_1$-$4_5$), current sources ($7_1$-$7_5$; $8_1$-$8_5$) and difference detection means ($13_1$-$13_5$).

As for the prior art described with respect to FIG. 2, the current of the current sources which operate actually as current sinks is supplied via the input terminals Vinp and Vinn through a suitable driving circuit, such as an emitter follower. Unlike in the prior art, Iref does not strictly need to be tuned to a current magnitude that is large with respect to the input currents of the difference detection means. A difference detection means will provide information on the voltage level when the voltage at both inputs, e.g. inputs $9_3$ and $10_3$, are almost equal. At this instance the input currents of both, the first and the second input terminal, are also equal, so that the voltage difference is not affected.

Careful analysis shows that the circuit of FIG. 3 requires tighter tolerances on resistor values than circuits based on resistor chains to achieve a given overall accuracy. For this reason, it may be necessary in some cases to calibrate the reference currents in order to meet accuracy requirements.

FIG. 4 illustrates the sample circuit where the current magnitudes k·Iref are distributed in the manner that k starts from 0 incrementing up to 4 from difference detection means $13_1$ towards difference detection means $13_5$ for the left hand side current sources $7_1$ to $7_5$ in FIG. 3 and decrementing from 4 down to 0 for the right hand side sources $8_1$ to $8_5$ in FIG. 3. The arrangement of the resistors $3_1$, $3_2$, $3_3$, $3_4$, and $3_5$ has not changed in that they are still connected on one side with the positive input terminal 1 and on the other side with the positive input port $9_1$ to $9_5$ of the difference detection means $13_1$ to $13_5$. Also resistors $4_1$ to $4_5$ are connected on one side with the negative input ports $10_1$ to $10_5$ and on the other side with negative input terminal 2. The current sources with currents of 0 have been left out of the drawing. For the example in FIG. 4 differential offset voltages L·R·Iref, with L∈{-4, -2, 0, 2, 4} are obtained which provide a linear distribution of the differential voltages.

Figure 5:
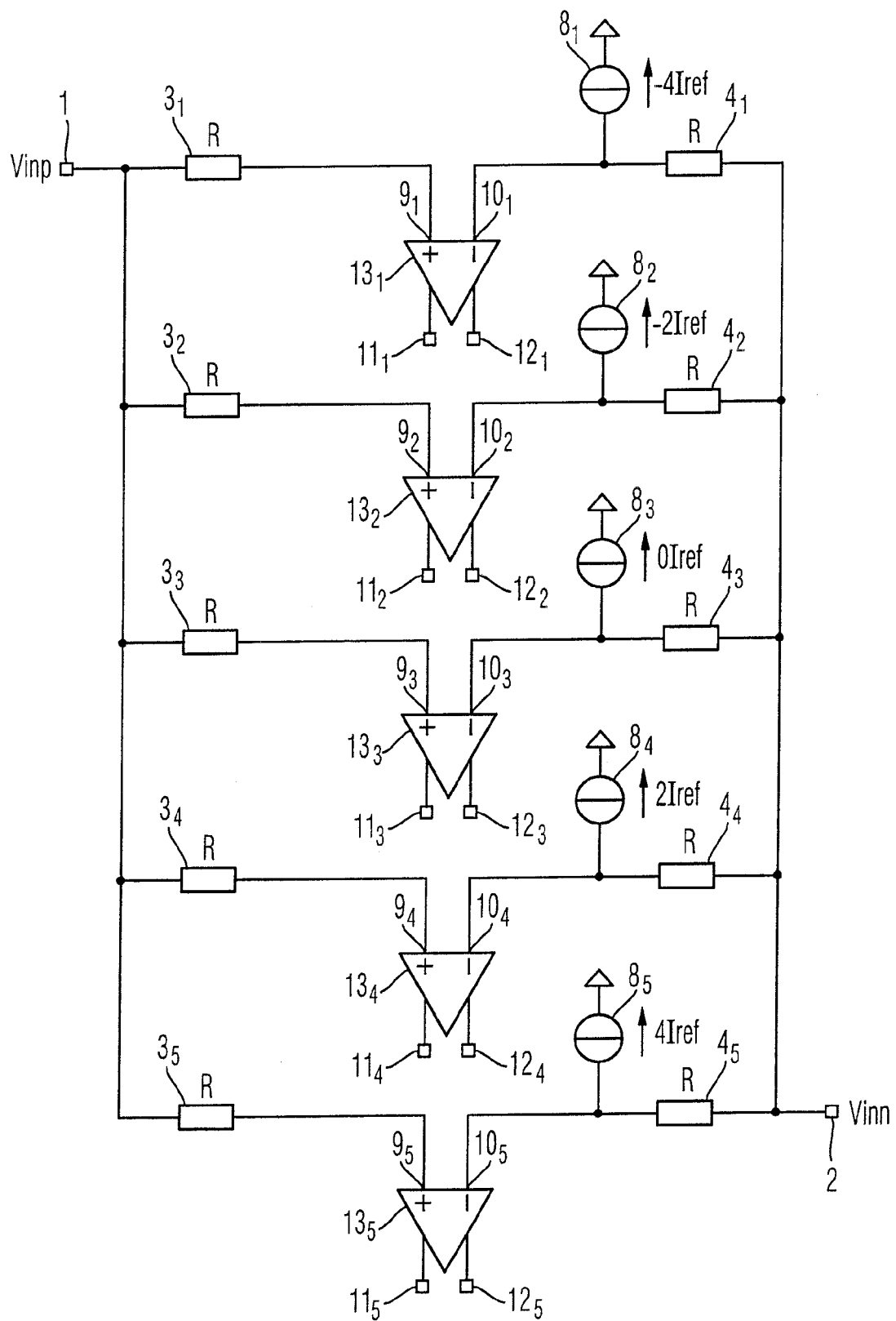
FIG. 5 shows a third embodiment of an analog/digital converter with a differential reference ladder according to the present invention and FIG. 6 shows a fourth embodiment of an analog/digital converter with a differential reference ladder according to the present invention.

FIG. 5 shows an embodiment where the currents of the left hand side current sources $7_1$ to $7_5$ of FIG. 3 are all set to zero and the right hand side current sources $8_1$ to $8_5$ provide currents that correspond to the differential offset voltages of the circuit shown in FIG. 4. The matrix representation of the current distribution is $$\begin{pmatrix} 0 & -4 \\ 0 & -2 \\ 0 & 0 \\ 0 & 2 \\ 0 & 4 \end{pmatrix}$$

in this case.

Figure 6:
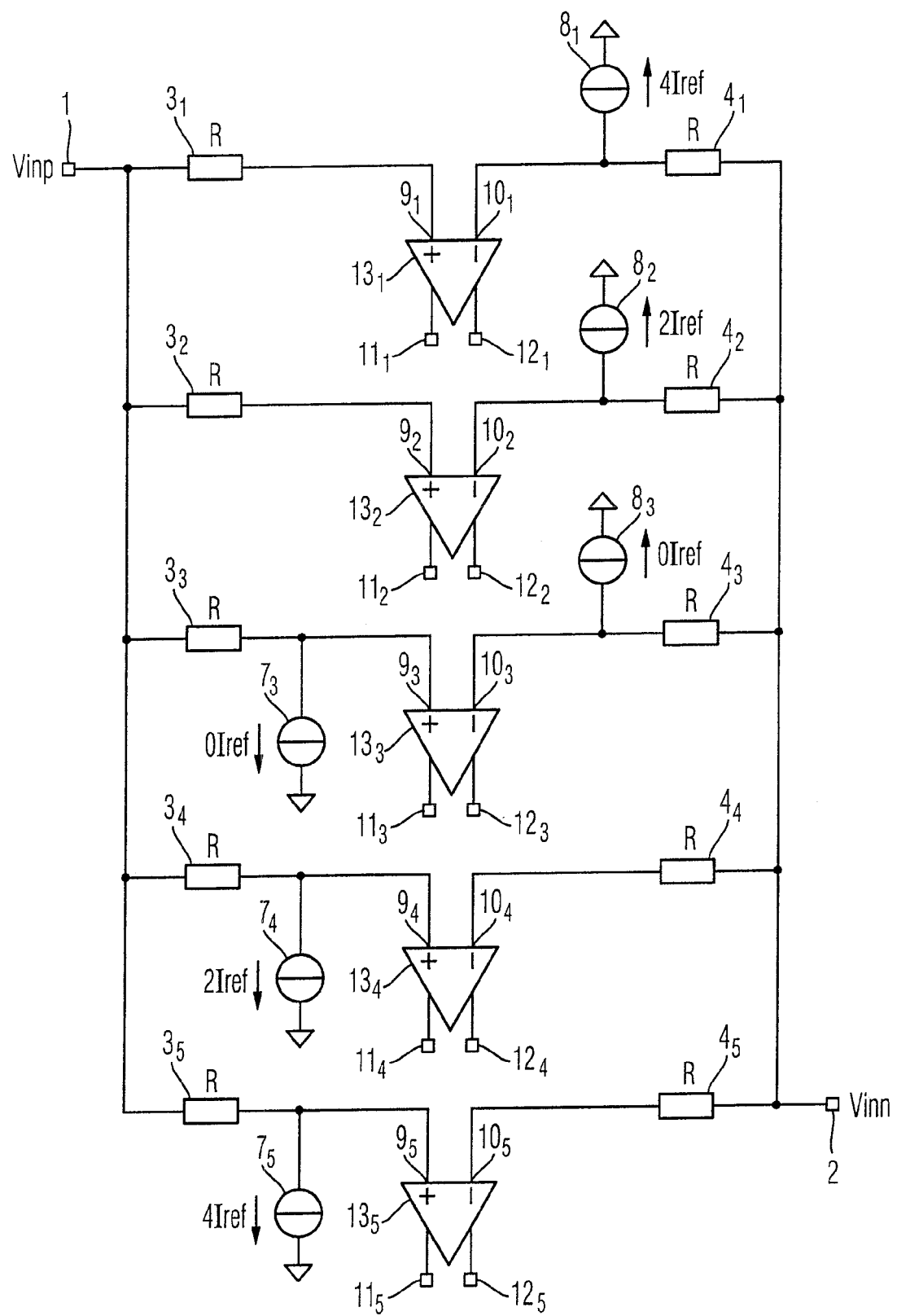

FIG. 6 shows an embodiment of the invention analog-to-digital converter with an asymmetric distribution of the current sources. As in FIG. 5 current sources with a current of 0 are left out and the corresponding matrix representation can be given as:

$$\begin{pmatrix} 0 & 4 \\ 0 & 2 \\ 0 & 0 \\ 2 & 0 \\ 4 & 0 \end{pmatrix}$$

The invention is not restricted to the above embodiments and can be used with different implementations. The current sources and the input stages of the differential amplifiers can be implemented in bipolar technology but also in CMOS technology. The current sources can be configured as current mirror circuits. All features described in this description and shown in the accompanying drawings can be combined.

The invention claimed is:
1. An analog-to-digital converter comprising:
   a positive input terminal;
   a negative input terminal;
   a plurality of difference detection means for detecting a voltage difference between a positive input port and a negative input port wherein for each of the difference detection means:

a first resistor connects the positive input port of the difference detection means with the positive input terminal; and a second resistor connects the negative input port of the difference detection means to the negative input terminal; and at least one current source;

wherein for each of said difference detection means, at least one of the first resistor and the second resistor connects directly between the respective input terminal and the respective input port of the difference detection means in the manner of a star network.

2. The analog-to-digital converter according to claim 1, wherein at least two first current sources are connected to the positive input port of at least two of the difference detection means generating different currents.

3. The analog-to-digital converter according to claim 1, wherein at least two second current sources are connected to the negative input port of at least two of the difference detection means generating different currents.

4. The analog-to-digital converter according to claim 1, wherein the first resistors have equal resistance.

5. The analog-to-digital converter according to claim 1, wherein the second resistors have equal resistance.

6. The analog-to-digital converter according to claim 1, wherein current sources generating a current differing from zero are connected to positive input ports only or to negative input ports of the difference detection means only.

7. An analog-to-digital converter comprising:
a positive input terminal;
a negative input terminal;
a plurality of difference detection means for detecting a voltage difference between a positive input port and a negative input port wherein for each of the difference detection means:
 a first resistor connects the positive input port of the difference detection means with the positive input terminal; and
 a second resistor connects the negative input port of the difference detection means to the negative input terminal; and
at least one current source;
wherein at least two first current sources are connected to the positive input port of at least two of the difference detection means generating different currents; and
wherein the difference of the currents of the first current sources increases or decreases linearly from one difference detection means to the next difference detection means.

8. An analog-to-digital converter comprising:
a positive input terminal;
a negative input terminal;
a plurality of difference detection means for detecting a voltage difference between a positive input port and a negative input port wherein for each of the difference detection means:
 a first resistor connects the positive input port of the difference detection means with the positive input terminal; and
 a second resistor connects the negative input port of the difference detection means to the negative input terminal; and
at least one current source;
wherein at least two first current sources are connected to the positive input port of at least two of the difference detection means generating different currents; and
wherein the difference of the currents of the first current sources increases or decreases nonlinearly from one difference detection means to the next difference detection means.

9. An analog-to-digital converter comprising:
a positive input terminal;
a negative input terminal;
a plurality of difference detection means for detecting a voltage difference between a positive input port and a negative input port wherein for each of the difference detection means:
 a first resistor connects the positive input port of the difference detection means with the positive input terminal; and
 a second resistor connects the negative input port of the difference detection means to the negative input terminal; and
at least one current source;
wherein at least two second current sources are connected to the negative input port of at least two of the difference detection means generating different currents; and
wherein the difference of the currents of the second current sources increases or decreases linearly from one difference detection means to the next difference detection means.

10. An analog-to-digital converter comprising:
a positive input terminal;
a negative input terminal;
a plurality of difference detection means for detecting a voltage difference between a positive input port and a negative input port wherein for each of the difference detection means:
 a first resistor connects the positive input port of the difference detection means with the positive input terminal; and
 a second resistor connects the negative input port of the difference detection means to the negative input terminal; and
at least one current source;
wherein the difference of the currents of the second current sources increases or decreases nonlinearly from one difference detection means to the next difference detection means.

11. An analog-to-digital converter comprising:
a positive input terminal;
a negative input terminal;
a plurality of difference detection means for detecting a voltage difference between a positive input port and a negative input port wherein for each of the difference detection means:
 a first resistor connects each positive input port of the difference detection means with the positive input terminal; and
 a second resistor connects the negative input port of the difference detection means to the negative input terminal; and
at least one current source;
wherein at least two first current sources are connected to the positive input port of at least two of the difference detection means generating different currents.

12. The analog-to-digital converter according to claim 11, wherein the sums of currents of the first and second current sources that are connected to the same difference detection means are equal for each difference detection means.

13. The analog-to-digital converter according to claim 12, wherein the currents generated by the first current sources are integer multiples of a reference current.

14. The analog-to-digital converter according to claim 12, wherein the reference currents of the first current sources and the reference currents of the second current sources are identical.

15. An analog-to-digital converter comprising:
a positive input terminal;
a negative input terminal;
a plurality of difference detection means for detecting a voltage difference between a positive input port and a negative input port wherein for each of the difference detection means:
  a first resistor connects the positive input port of the each difference detection means with the positive input terminal; and
  a second resistor connects the negative input port of the difference detection means to the negative input terminal; and
at least one current source;
wherein a first difference detection means has a current source only at its negative input port.

16. The analog-to-digital converter according to claim 15, wherein a last difference detection means has a current source only at its positive input port.

17. The analog-to-digital converter according to claim 16, wherein the remaining difference detection means have current sources at its positive input ports and its negative input ports.

18. An analog-to-digital converter comprising:
a positive input terminal;
a negative input terminal;
a plurality of difference detection means for detecting a voltage difference between a positive input port and a negative input port wherein for each of the difference detection means:
  a first resistor connects the positive input port of the difference detection means with the positive input terminal; and
  a second resistor connects the negative input port of the difference detection means to the negative input terminal; and
at least one current source;
wherein first current sources generating a current differing form zero are only connected to the positive input ports of a first set of difference detection means and wherein second current sources generating a current differing from zero are only connected to the negative input ports of a second set of difference detection means, whereby the first set and the second set do not comprise any identical difference detection means.

* * * * *